(12) United States Patent
Jeong et al.

(10) Patent No.: US 9,117,910 B2
(45) Date of Patent: Aug. 25, 2015

(54) SEMICONDUCTOR DEVICE AND FABRICATING METHOD THEREOF

(71) Applicant: SAMSUNG ELECTRONICS CO., LTD., Suwon-si, Gyeonggi-do (KR)

(72) Inventors: Heedon Jeong, Hwaseong-si (KR); Jae Yup Chung, Yongin-si (KR); Heesoo Kang, Seoul (KR); Donghyun Kim, Yongin-si (KR); Sanghyuk Hong, Yongin-si (KR); Soohun Hong, Gunpo-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/313,435

(22) Filed: Jun. 24, 2014

(65) Prior Publication Data

US 2014/0374830 A1    Dec. 25, 2014

(30) Foreign Application Priority Data

Jun. 25, 2013  (KR) .......................... 10-2013-0073231

(51) Int. Cl.
*H01L 29/66* (2006.01)
*H01L 29/78* (2006.01)

(52) U.S. Cl.
CPC ........ *H01L 29/7855* (2013.01); *H01L 29/7831* (2013.01)

(58) Field of Classification Search
CPC ................... H01L 29/41791; H01L 29/66795; H01L 27/0886
See application file for complete search history.

(56) References Cited

U.S. PATENT DOCUMENTS

| | | | |
|---|---|---|---|
| 6,218,262 B1 | 4/2001 | Kuroi et al. | |
| 7,863,152 B2 | 1/2011 | Lee et al. | |
| 8,350,253 B1 | 1/2013 | Zhu et al. | |
| 8,916,460 B1* | 12/2014 | Kwon et al. | 438/595 |
| 2011/0003450 A1 | 1/2011 | Lee et al. | |
| 2012/0025315 A1 | 2/2012 | Kronholz et al. | |
| 2012/0091539 A1 | 4/2012 | Fan et al. | |
| 2012/0217583 A1 | 8/2012 | Zhu et al. | |
| 2013/0187237 A1 | 7/2013 | Yu et al. | |
| 2014/0353763 A1* | 12/2014 | Chung et al. | 257/390 |

FOREIGN PATENT DOCUMENTS

KR    10-2011-0003217 A    1/2011

* cited by examiner

*Primary Examiner* — Daniel Whalen
(74) *Attorney, Agent, or Firm* — Lee & Morse, P.C.

(57) ABSTRACT

A semiconductor device includes a fin region with long and short sides, a first field insulating layer including a top surface lower than that of the fin region and adjacent to a side surface of the short side of the fin region, a second field insulating layer including a top surface lower than that of the fin region and adjacent to a side surface of the long side of the fin region, an etch barrier pattern on the first field insulating layer, a first gate on the fin region and the second field insulating layer to face a top surface of the fin region and side surfaces of the long sides of the fin region. A second gate is on the etch barrier pattern overlapping the first field insulating layer. A source/drain region is between the first gate and the second gate, in contact with the etch barrier pattern.

17 Claims, 18 Drawing Sheets

SEMICONDUCTOR DEVICE AND FABRICATING METHOD THEREOF

CROSS-REFERENCE TO RELATED APPLICATION

Korean Patent Application No. 10-2013-0073231 filed on Jun. 25, 2013, in the Korean Intellectual Property Office, and entitled: "SEMICONDUCTOR DEVICE AND FABRICATING METHOD THEREOF," is incorporated by reference herein in its entirety.

BACKGROUND

Embodiments relate to a semiconductor device and a fabricating method thereof. More particularly, embodiments relate to a semiconductor device including a three-dimensional channel and a fabricating method thereof.

SUMMARY

Embodiments are directed to a semiconductor device including a fin region with a long side and a short side, a first field insulating layer including a top surface lower than a top surface of the fin region, the first field insulating layer being adjacent to a side surface of the short side of the fin region, a second field insulating layer including a top surface lower than the top surface of the fin region, the second field insulating layer being adjacent to a side surface of the long side of the fin region, an etch barrier pattern on the first field insulating layer, a first gate on the fin region and the second field insulating layer, the first gate facing the top surface of the fin region and a side surface of the long side of the fin region, a second gate on the etch barrier pattern, the second gate being in an overlapping relationship with the first field insulating layer, and a source/drain region between the first gate and the second gate, the source/drain region being in contact with the etch barrier pattern.

A distance from the top surface of the fin region to the top surface of the first field insulating layer may be less than a distance from the top surface of the fin region to the top surface of the second field insulating layer.

A thickness of the first gate on the fin region may be less than a thickness of the second gate on the etch barrier pattern.

The etch barrier pattern may include a first portion covering the first field insulating layer and a second portion between the source/drain region and the second gate, the second portion extending upward from the first portion.

The device may further include a gate spacer on a sidewall of the second gate, wherein the second portion of the etch barrier pattern is in contact with the gate spacer and the source/drain region.

The etch barrier pattern may include a first insulating pattern and a second insulating pattern. The first portion may include the first insulating pattern and the second insulating pattern. The second portion may include the second insulating pattern.

The first insulating pattern may include a silicon oxide layer. The second insulating pattern may include a silicon nitride layer or a silicon oxynitride layer.

Embodiments are also directed to a semiconductor device including a pair of fin regions, at least one first gate crossing each of the pair of fin regions, a second gate parallel to the first gate and between the pair of fin regions, a first field insulating layer below the second gate, a second field insulating layer below the first gate, source/drain regions between the first and second gates, and an etch barrier pattern between the first field insulating layer and the second gate, the etch barrier pattern covering sidewalls of the source/drain regions.

The first field insulating layer may have a top surface lower than top surfaces of the fin regions. The second field insulating layer may have a top surface lower than a top surface of the first field insulating layer. The first and second field insulating layers extending along different directions from each other.

The etch barrier pattern may include a horizontal portion between the first field insulating layer and the second gate, and an extended portion extending upward from the horizontal portion to cover the sidewalls of the source/drain regions.

The etch barrier pattern may include an insulating pattern covering bottom and lower side surfaces of the second gate, thereby having a 'U'-shaped section, the insulating pattern directly covering the sidewalls of the source drain regions.

The insulating pattern may include a nitride layer.

Embodiments are also directed to a method of fabricating a semiconductor including forming a fin region with a short side and a long side on a substrate, forming a first field insulating layer including a top surface lower than a top surface of the fin region, the first field insulating layer being adjacent to a side surface of the short side of the fin region and a side surface of the long side of the fin region, forming an etch barrier pattern on the first field insulating layer to be in contact with the side surface of the short side of the fin region, forming a recess region in the fin region, and forming an epitaxial layer in the recess region. The etch barrier pattern includes at least one insulating pattern that has an etch-resistant property when the recess region is formed.

The method may further include etching the first field insulating layer using the etch barrier pattern as an etch mask to form a second field insulating layer having a top surface lower than the top surface of the fin region, the second field insulating layer being adjacent to the side surface of the long side of the fin region.

The insulating pattern may include a silicon nitride layer or a silicon oxynitride layer.

The etch barrier pattern may include a first insulating pattern, a second insulating pattern, and a buffer pattern that are sequentially formed. The first insulating pattern may include a silicon oxide layer. The second insulating pattern may include a silicon nitride layer or a silicon oxynitride layer. The buffer pattern includes a polysilicon layer, an amorphous silicon layer, or a silicon oxide layer.

The method may further include sequentially forming a first sacrificial gate and a first mask pattern on a portion of the fin region, forming a first gate spacer on sidewalls of the first sacrificial gate and the first mask pattern, sequentially forming a second sacrificial gate and a second mask pattern on the etch barrier pattern, and forming a second gate spacer on sidewalls of the first sacrificial gate and the second mask pattern. The forming of the recess region may include etching portions of the fin region adjacent to the first gate spacer and the second gate spacer.

Embodiments are also directed to a semiconductor device including a pair of fin regions, each of the pair of fin regions being crossed by at least one first gate, a second gate between the pair of fin regions, the second gate including a second gate electrode parallel to the first gate, a first field insulating layer below the second gate, source/drain epitaxial regions in the fin regions between the first and second gates, the source/drain epitaxial regions having sidewalls facing the second gate, and an etch barrier pattern between the first field insulating layer and the second gate, and between the source/drain epitaxial regions and the second gate.

The etch barrier pattern may include a first portion between the first field insulating layer and the second gate and a second portion between the source/drain epitaxial regions and the second gate. The first portion of the etch barrier pattern may include a silicon oxide layer. The second portion of the etch barrier pattern may include a silicon nitride layer or a silicon oxynitride layer.

The device may further include a gate insulating layer between the second gate electrode and the etch barrier pattern.

The device may further include a gate spacer on a side surface of the second gate. The second portion of the etch barrier pattern may extend between a lower portion of the gate spacer and the source/drain epitaxial regions.

The first field insulating layer may have a top surface lower than a top surface of the fin regions. The source/drain epitaxial regions may be in recess portions of the fin regions. Bottom surfaces of the source/drain epitaxial regions may be lower than a top surface of the first field insulating region.

BRIEF DESCRIPTION OF THE DRAWINGS

Features will become apparent to those of skill in the art by describing in detail exemplary embodiments with reference to the attached drawings in which.

Figure 1:
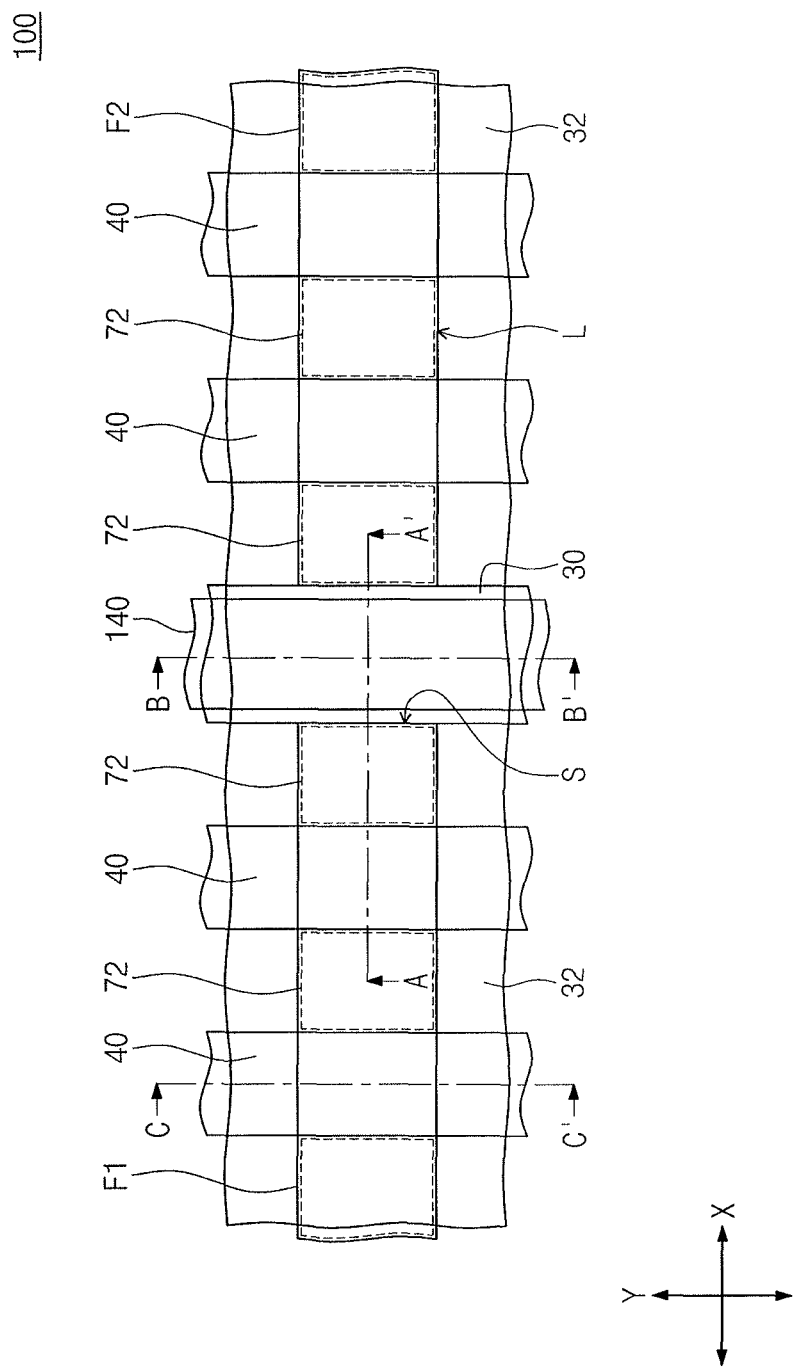
FIG. 1 is a schematic plan view illustrating a semiconductor device according to example embodiments.

It should be noted that these figures are intended to illustrate the general characteristics of methods, structure, and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2A:
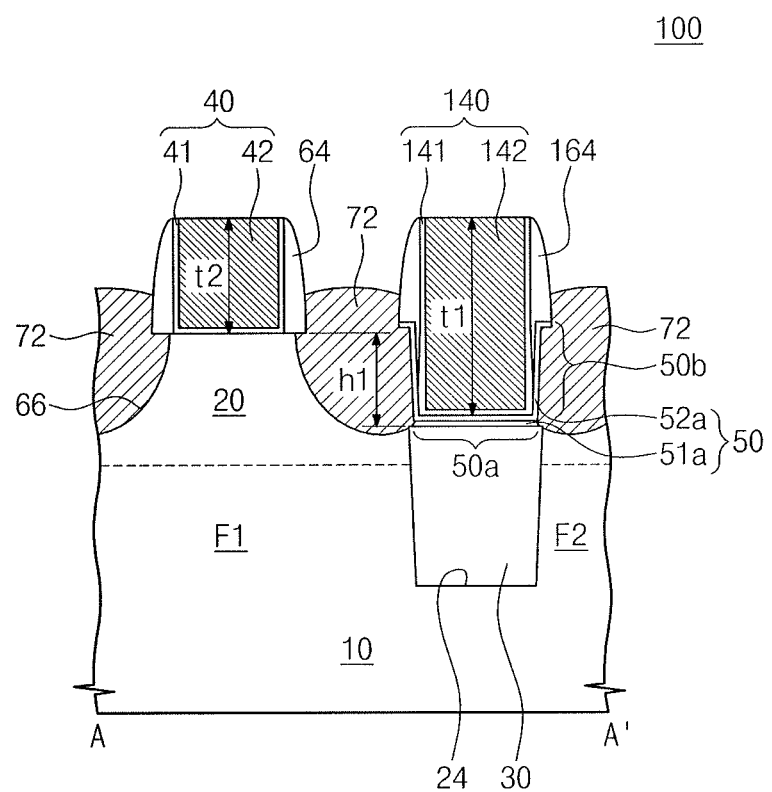
FIG. 2A illustrates a schematic sectional view taken along a line A-A' of FIG. 1 to illustrate a semiconductor device according to example embodiments.
Figure 2B:
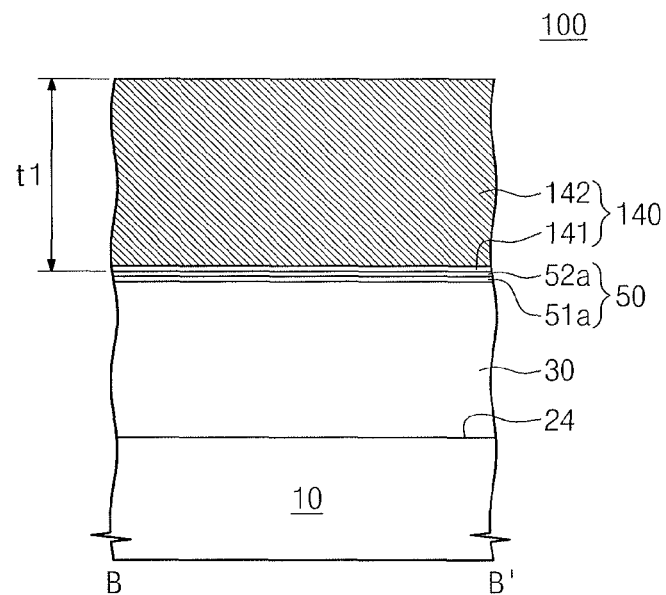
FIG. 2B illustrates a schematic sectional view taken along a line B-B' of FIG. 1 to illustrate a semiconductor device according to example embodiments.
Figure 2C:
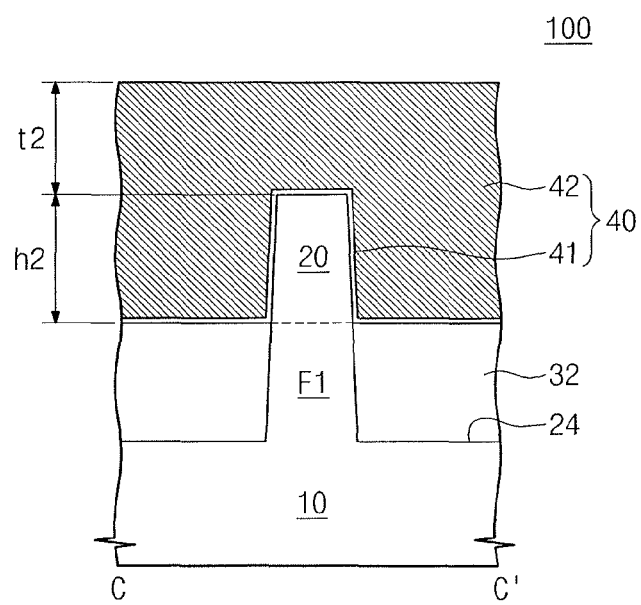
FIG. 2C illustrates a schematic sectional view taken along a line C-C' of FIG. 1 to illustrate a semiconductor device according to example embodiments.

FIG. 1 and FIGS. 2A through 2C are plan and sectional views schematically illustrating a semiconductor device according to example embodiments. Here, FIGS. 2A, 2B, and 2C are sectional views taken along lines A-A', B-B', and C-C', respectively, of FIG. 1.

Referring to FIG. 1 and FIGS. 2A through 2C, a semiconductor device 100 may include at least one pair of the fin regions F1 and F2, at least one first gate 40, a second gate 140, a first field insulating layer 30, a second field insulating layer 32, and source/drain regions 72.

The fin regions F1 and F2 may extend along a first direction X. The fin regions F1 and F2 may be a portion of a substrate 10 or may include an epitaxial layer grown from the substrate 10. As shown in the drawings, a pair of the fin regions F1 and F2 may be disposed side by side along the first direction X, as an example.

The substrate 10 may include at least one semiconductor material selected from the group of Si, Ge, SiGe, GaP, GaAs, SiC, SiGeC, InAs, and InP. The substrate 10 may be provided in the form of a silicon-on-insulator (SOI) wafer.

As shown in the drawings, the fin regions F1 and F2 may have rectangular top surfaces, as an example. In other implementations, the top surface of each of the fin regions F1 and F2 may have rounded corners. Each of the fin regions F1 and F2 may have a long side L extending along the first direction X and a short side S extending along a second direction Y. Each of the fin regions F1 and F2 may have a length and a width. The first direction X and the second direction Y may be selected to form a specific angle. For example, the first direction X and the second direction Y may be perpendicular to each other. In some implementations, the first direction X may be a length direction of the fin regions F1 and F2, while the second direction Y may be a width direction of the fin regions F1 and F2. The short side S of the first fin region F1 may be formed to face the short side S of the second fin region F2.

Each of the fin regions F1 and F2 may be used as an active or channel region of a multi-gate transistor or a fin-shaped field effect transistor (hereinafter, referred as to a 'fin-FET').

The first and second field insulating layers 30 and 32 may be formed in a trench 24 defining the short side S and the long side L of the fin regions F1 and F2. The first field insulating layer 30 may be adjacent to a side surface of the short side S of the fin regions F1 and F2, and the second field insulating layer 32 may be adjacent to a side surface of the long side L of the fin regions F1 and F2. For example, the first field insulating layer 30 may be disposed between the first fin region F1 and the second fin region F2 to be in partial contact with side surfaces of the short sides S of the first fin region F1 and the second fin region F2. The first field insulating layer 30 may extend along the second direction Y. The second field insulating layer 32 may be disposed to be in partial contact with a portion of a side surface of the long side L of the fin regions F1 and F2 and be elongated along the first direction X. The first and second field insulating layers 30 and 32 may be connected to each other. The first and second field insulating layers 30 and 32 may include an oxide layer, a nitride layer, an oxynitride layer, or any combination thereof.

The first and second field insulating layers 30 and 32 may be recessed by specific depths to have top surfaces lower than those of the fin regions F1 and F2. Referring to FIGS. 2A and 2C, a first distance h1 from the top surfaces of the fin regions F1 and F2 to the top surface of the first field insulating layer 30 may be different from a second distance h2 from the top surfaces of the fin regions F1 and F2 to the top surface of the second field insulating layer 32. For example, the first distance h1 may be less than the second distance h2. The top surface of the second field insulating layer 32 may be lower than the top surface of the first field insulating layer 30.

In other implementations, the first and second field insulating layers 30 and 32 may have top surfaces that are coplanar with each other. For example, the first distance h1 from the top surfaces of the fin regions F1 and F2 to the top surface of the first field insulating layer 30 may be substantially equivalent to the second distance h2 from the top surface of the fin regions F1 and F2 to the top surface of the second field insulating layer 32.

Each of the fin regions F1 and F2 may include at least one region (hereinafter, referred to as a 'first region 20') that is higher than the top surface of the second field insulating layer 32 and may be used as a channel region of the multi-gate transistor or the Fin-FET FINFET. The first and second field insulating layers 30 and 32 may enclose or partially cover the side surface of each of the fin regions F1 and F2.

The first field insulating layer 30 may be disposed below the second gate 140, and the second field insulating layer 32 may be disposed below the first gate 40. The first gate 40 may serve as a normal gate electrode for operating a transistor. The second gate 140 may serve as a dummy gate electrode that is not used to operate the transistor. In some implementations, the second gate 140 may serve as an interconnection line for transmitting signals.

The first gate 40 may include a first gate insulating layer 41 and a first gate electrode 42. The second gate 140 may include a second gate insulating layer 141 and a second gate electrode 142.

The at least one first gate 40 may be disposed on the second field insulating layer 32 and the fin regions F1 and F2 to cover the top surface and a side surface of the long side L of each of the fin regions F1 and F2. For example, the at least one first gate 40 may enclose or cover the top and side surfaces of the first region 20 in each of the fin regions F1 and F2. The at least one first gate 40 may be in an overlapping relationship with the second field insulating layer 32 and may be elongated along the second direction Y.

The second gate 140 may be formed on the first field insulating layer 30. The second gate 140 may be in an overlapping relationship with the first field insulating layer 30 and may be elongated along the second direction Y. The second gate 140 may be disposed between the fin regions F1 and F2 and may be elongated along the second direction Y or along a direction parallel to the first gate 40. A bottom surface of the second gate 140 may be lower than the top surfaces of the fin regions F1 and F2. Although FIG. 1 illustrates the second gate 140 singly provided on the first field insulating layer 30, in other implementations, the number of the second gate 140 to be disposed on the first field insulating layer 30 may be two or more. A bottom width of the second gate electrode 142 of the second gate 140 may be smaller than a width of the top surface of the first field insulating layer 30.

The first and second gates 40 and 140 may have top surfaces that are coplanar with each other. For example, in the case where the first and second gates 40 and 140 are formed by a planarization process, the top surfaces of the first and second gates 40 and 140 may be coplanar with each other. A first thickness t1 of the second gate 140 on the first field insulating layer 30 may be greater than a second thickness t2 of the first gate 40 on the fin regions F1 and F2.

Each of the gate electrodes 42 and 142 may include at least one metal layer. For example, each of the gate electrodes 42 and 142 may include at least a first metal layer and a second metal layer. The first metal layer may be interposed between the second metal layer and the fin regions F1 and F2 to control work functions of the gate electrodes 42 and 142, and the second metal layer may fill an inner space defined by the first metal layer. For example, the first metal layer may include at least one of TiN, TaN, TiC, or TaC. The second metal layer may include W or Al. The gate electrodes 42 and 142 may be formed by, for example, a replacement process or a gate last process.

The first gate insulating layer 41 may be formed between the fin regions F1 and F2 and the first gate electrode 42. The first gate insulating layer 41 may be formed on the top and side surfaces of the fin regions F1 and F2. For example, the first gate insulating layer 41 may be formed on the top and side surfaces of the first region 20 that is contained in the fin regions F1 and F2. Further, the first gate insulating layer 41 may be formed between the first gate electrode 42 and the second field insulating layer 32. The second gate insulating layer 141 may be formed between the second gate electrode 142 and an etch barrier pattern 50 formed on the first field insulating layer 30. The gate insulating layers 41 and 141 may include a high-k material having a dielectric constant that is higher than that of silicon oxide. For example, the gate insulating layers 41 and 141 may include $HfO_2$, $ZrO_2$, or $Ta_2O_5$.

A first gate spacer 64 may be formed on a side surface of the first gate 40 and a second gate spacer 164 may be formed on a side surface of the second gate 140. The gate spacers 64 and 164 may include at least one of a silicon nitride layer or a silicon oxynitride layer.

The etch barrier pattern 50 may be disposed on the first field insulating layer 30 between the fin regions F1 and F2 to extend along the second direction Y. The etch barrier pattern 50 may include a first portion 50a covering the first field insulating layer 30 and a second portion 50b interposed between the source/drain regions 72 and the second gate 140 to extend upward from the first portion 50a. The second portion 50b may be formed between the second gate 140 and the source/drain regions 72 adjacent thereto or between the source/drain regions 72, which are positioned between the first and second gates 40 and 140, and the second gate 140. The first portion 50a may be a horizontal portion interposed between the second gate 140 and the first field insulating layer 30, and the second portion 50b may be an extended portion extending upward from the first portion 50a. The second portion 50b may further include a portion horizontally extending along a bottom surface of the second gate spacer 164.

The etch barrier pattern 50 may be in contact with the source/drain regions 72 disposed between the first and second gates 40 and 140. For example, the second portion 50b may be in contact with the source/drain regions 72 disposed between the first and second gates 40 and 140. For example, the second portion 50b may cover side surfaces of the source/drain regions 72 disposed between the first and second gates 40 and 140. Due to the presence of the etch barrier pattern 50, it may be possible to prevent the source/drain regions 72 from becoming connected to the second gate electrode 142. The second portion 50b may be in contact with the second gate spacer 164 and the second gate insulating layer 141. The first portion 50a may be in contact with the first field insulating layer 30 and the second gate insulating layer 141. The etch barrier pattern 50 may include a nitride layer. For example, the etch barrier pattern 50 may include a silicon oxynitride layer or a silicon nitride layer. In example embodiments, the etch barrier pattern 50 may include a first insulating pattern 51a and a second insulating pattern 52a. The first insulating pattern 51a may include an oxide, and the second insulating pattern 52a may include a nitride. For example, the first insulating pattern 51a may include a silicon oxide layer, and the second insulating pattern 52a may include a silicon oxynitride layer or a silicon nitride layer.

In example embodiments, the second insulating pattern 52a of the etch barrier pattern 50 may be formed to cover bottom and lower side surfaces of the second gate 140. For example, the second insulating pattern 52a may be formed to have a 'U'-shaped section. Further, the second insulating pattern 52a may directly cover a sidewall of the source/drain regions 72 adjacent to the second gate 140.

In example embodiments, the second portion 50b may include the second insulating pattern 52a. The first portion 50a may include the second insulating pattern 52a and the first insulating pattern 51a.

In other implementations, the first portion 50a may include only the second insulating pattern 52a, without the first insulating pattern 51a. In this case, the second insulating pattern 52a may be in direct contact with the first field insulating layer 30.

In example embodiments, the second insulating pattern 52a of the second portion 50b may be in direct contact with not only the second gate insulating layer 141 and the source/drain regions 72 adjacent to the second gate 140 but also with the second gate spacer 164. The second insulating pattern 52a of the first portion 50a may be in direct contact with the second gate insulating layer 141 provided thereon and the first insulating pattern 51a provided thereunder. The first insulating pattern 51a of the first portion 50a may be in contact with the first field insulating layer 30 and may be an isolated pattern locally provided on the first field insulating layer 30. The first insulating pattern 51a may be in contact with the source/drain regions 72 adjacent to the second gate 140. In some implementations, the first insulating pattern 51a of the first portion 50a may be in contact with the first field insulating layer 30 and may further include a portion that extends vertically from the top surface of the first field insulating layer 30 to be in contact with a side surface of the short side S.

The source/drain regions 72 may be disposed between the first and second gates 40 and 140. For example, the source/drain regions 72 may be formed in recess regions 66 formed between a pair of the first gates 40 and between the first and second gates 40 and 140. The recess regions 66 may be formed by partially recessing the fin regions F1 and F2. The source/drain regions 72 may include an epitaxial layer including a semiconductor material. For example, an epitaxial layer including a semiconductor material may be formed in the recess regions 66. Further, the source/drain regions 72 may be formed to protrude from the top surfaces of the fin regions F1 and F2 and may have an elevated source/drain structure. In the case where the source/drain regions 72 include an epitaxial layer, a portion of the etch barrier pattern 50 may be in contact with the epitaxial layer. For example, the second insulating pattern 52a of the etch barrier pattern 50 may be in partial contact with the epitaxial layer.

In the case where the semiconductor device 100 is a PMOS transistor, the source/drain regions 72 may include a compressive stress material, having a lattice constant that is greater than that of silicon (Si). For example, the source/drain regions 72 may include silicon germanium (SiGe). Due to the presence of the compressive stress material, a compressive stress may be exerted to the fin regions F1 and F2, which may make it possible to increase mobility of carriers in the channel region.

In the case where the semiconductor device 100 is an NMOS transistor, the source/drain regions 72 may include the same material as the substrate 10 or may include a tensile stress material. In the case where the substrate 10 is made of, for example, silicon (Si), the source/drain region 72 may be formed of silicon (Si) or a semiconductor material (e.g., silicon carbide (SiC)), having a lattice constant that is smaller than that of silicon (Si).

A silicide layer may be further formed on the source/drain regions 72. The silicide layer may include a metallic element, such as nickel (Ni), cobalt (Co), platinum (Pt), or titanium (Ti).

FIGS. 3 through 12 are schematic sectional views illustrating stages of a process of fabricating a semiconductor device, according to example embodiments. In detail, each of FIGS. 3 through 12 may be sectional views taken along lines A-A', B-B', and C-C' of FIG. 1 to illustrate intermediate steps of the process.

Figure 3:
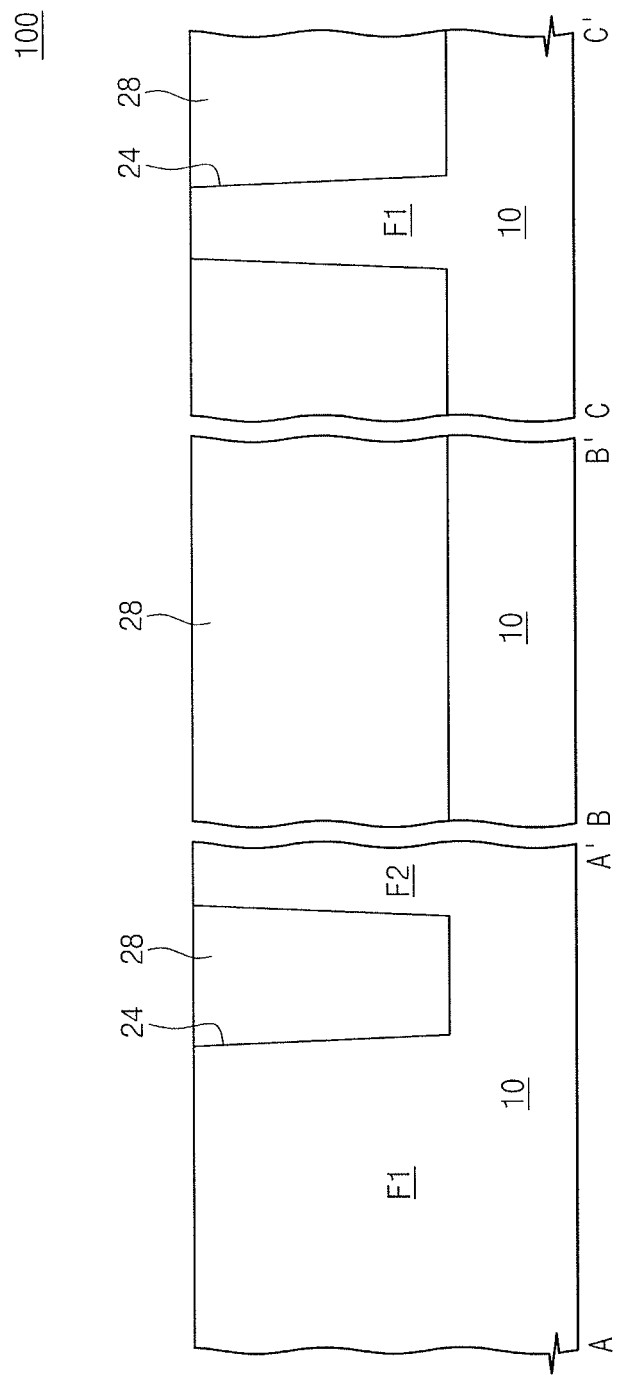
FIGS. 3 through 12 are schematic sectional views illustrating stages of a process of fabricating a semiconductor device, according to example embodiments.

Referring to FIGS. 1 and 3, at least one pair of fin regions F1 and F2, each having a long side L and a short side S, may be formed on the substrate 10. For example, the substrate 10 may be etched to form the trench 24. The trench 24 may be formed to define the first and second fin region F1 and F2 that are arranged side by side. Thereafter, a field insulating layer 28 may be formed to fill the trench 24 and then planarized. As a result, the fin regions F1 and F2 may be surrounded by the field insulating layer 28. The field insulating layer 28 may be in contact with the side surfaces of the long and short sides L and S of each of the fin regions F1 and F2.

Figure 4:
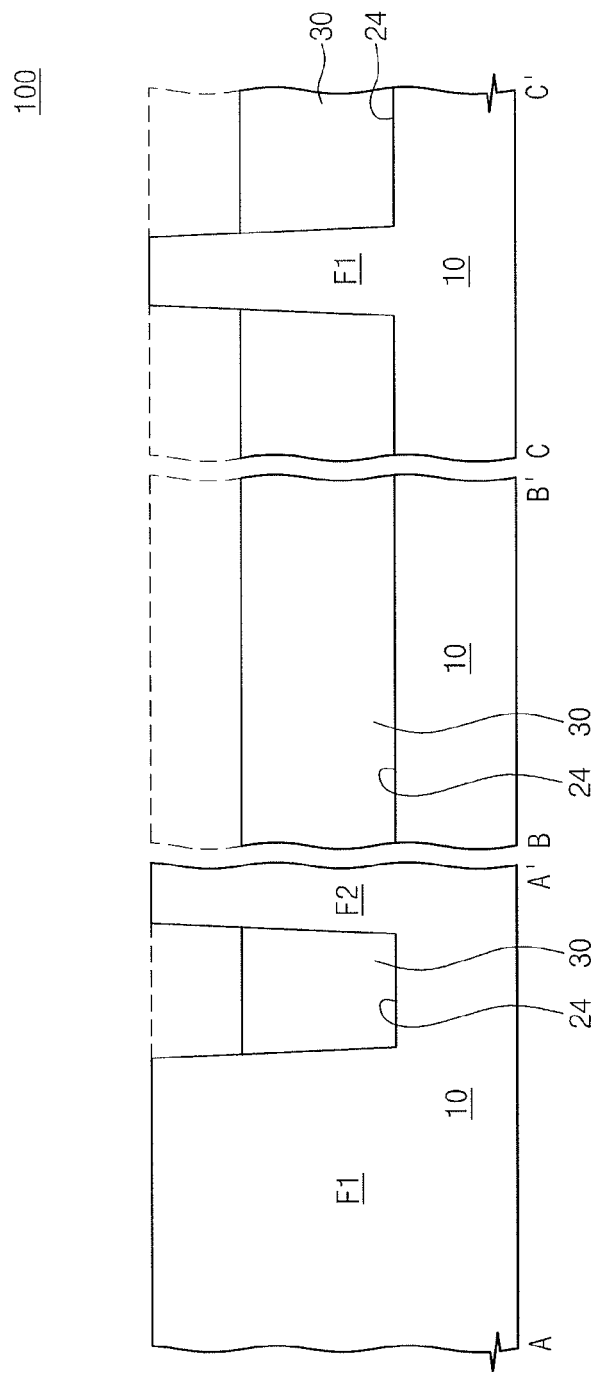

Referring to FIGS. 1 and 4, the field insulating layer 28 may be etched to form the first field insulating layer 30 exposing the side surfaces of the long and short sides L and S of the fin regions F1 and F2. The first field insulating layer 30 may be formed to be adjacent to the side surfaces of the long and short sides L and S of the fin regions F1 and F2 and have a top surface that is lower than the top surfaces of the fin regions F1 and F2.

Figure 5:
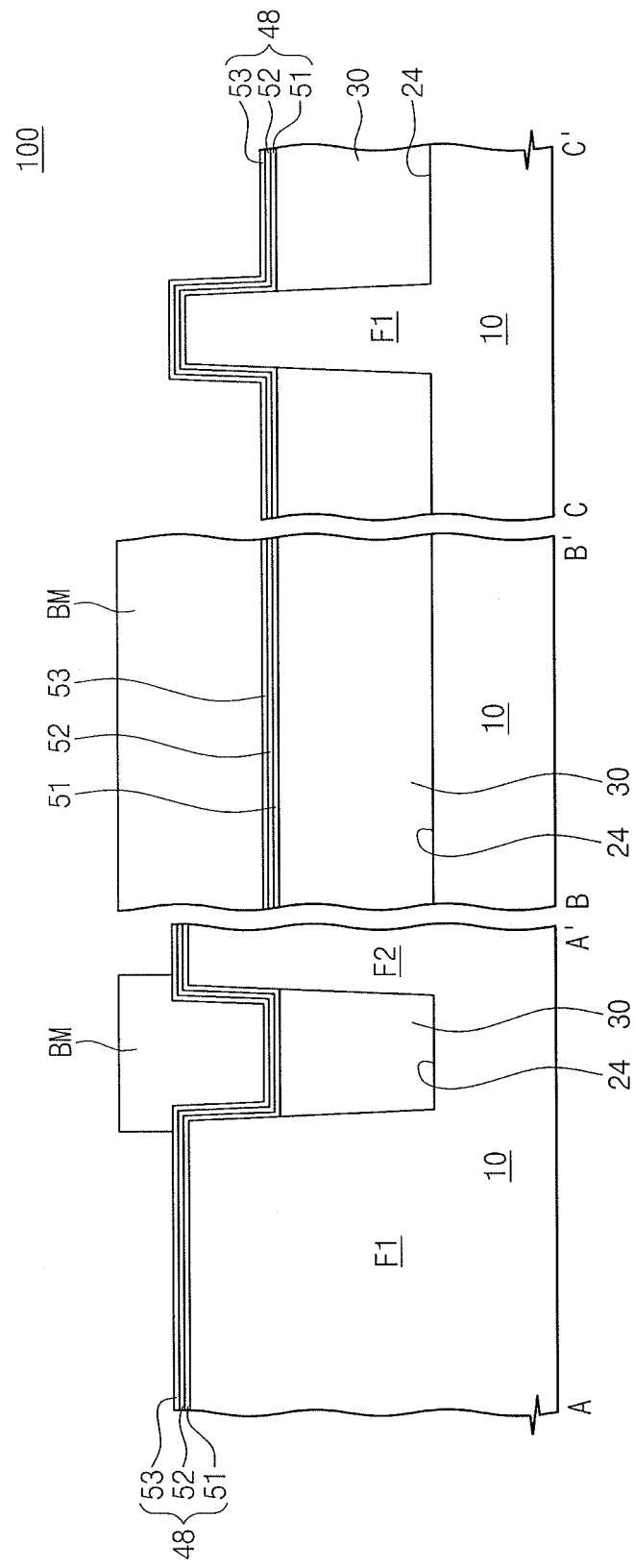

Referring to FIGS. 1 and 5, an etch barrier layer 48 may be formed on the fin regions F1 and F2 and the first field insulating layer 30. In example embodiments, the etch barrier layer 48 may include a first insulating layer 51, a second insulating layer 52, and a buffer layer 53, which may be sequentially stacked. In other implementations, the etch barrier layer 48 may be configured to include the first insulating layer 51 and the second insulating layer 52 which may be sequentially stacked or the second insulating layer 52 and the buffer layer 53 which may be sequentially stacked.

The second insulating layer 52 may be formed of a material having an etch selectivity with respect to at least one of the first insulating layer 51 and the buffer layer 53. For example, the first insulating layer 51 may include an oxide, and the second insulating layer 52 may include a nitride. In example embodiments, the first insulating layer 51 may include a silicon oxide layer, and the second insulating layer 52 may include a silicon oxynitride layer or a silicon nitride layer. The buffer layer 53 may include a polysilicon layer, an amorphous silicon layer or, an oxide layer.

A first mask BM may be formed on the etch barrier layer 48. The first mask BM may extend along the second direction Y between the fin regions F1 and F2. For example, the first mask BM may be disposed on the first field insulating layer 30, which is adjacent to the side surface of the short side S of the fin regions F1 and F2, to extend along the second direction Y. The first mask BM may include a hard mask layer or a photoresist layer. The hard mask layer may be formed of, for example, a spin-on-hardmask (SOH) layer. The SOH layer may be a hydrocarbon-based insulating layer.

Figure 6:
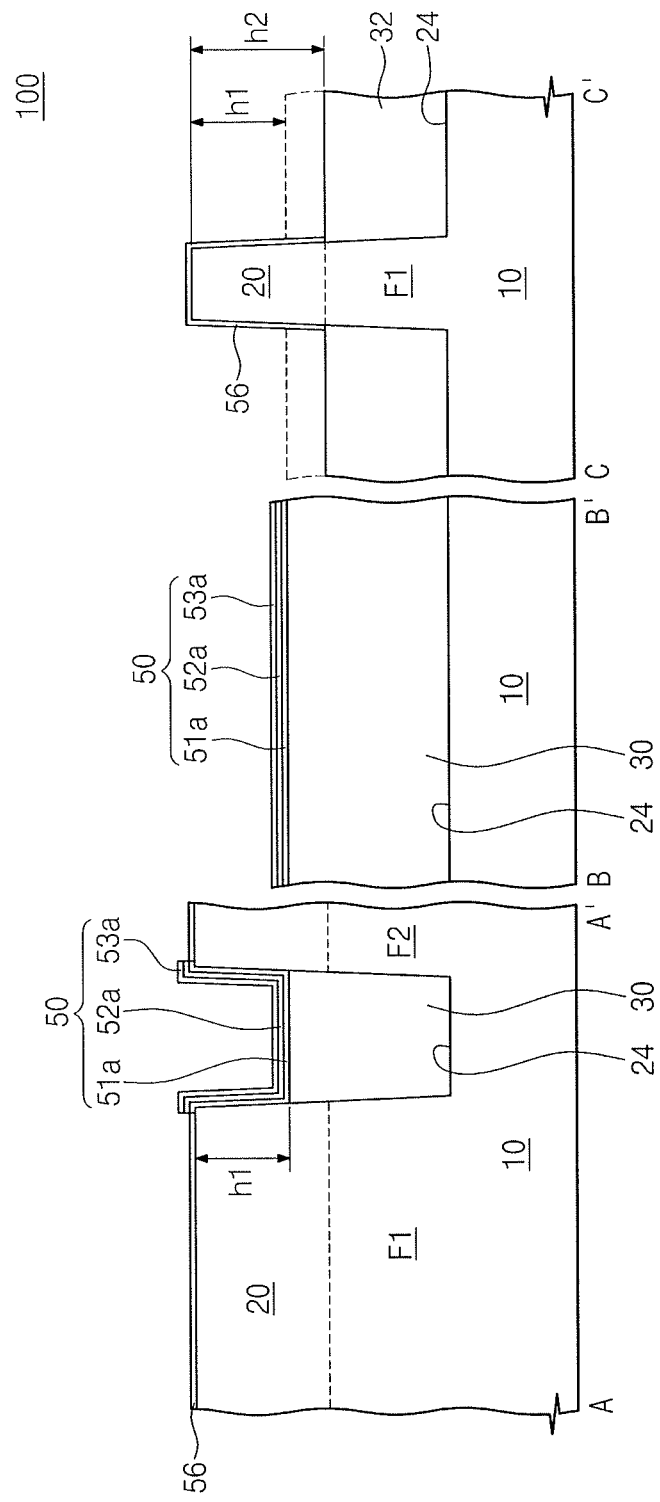

Referring to FIGS. 1 and 6, the etch barrier layer 48 may be patterned to form the etch barrier pattern 50 on the first field insulating layer 30. The patterning of the etch barrier layer 48 may be performed using the first mask BM as an etch mask.

In example embodiments, when measured in a direction of a longitudinal axis of the fin regions F1 and F2 or in the first direction X, a width of the first mask BM may be greater than a space between the fin regions F1 and F2 adjacent thereto. Accordingly, the etch barrier pattern 50 may include at least one upper horizontal portion covering a top surface of at least one of the fin regions F1 and F2. For example, an upper horizontal portion of the etch barrier pattern 50 may be formed on one or both of the top surfaces of the fin regions F1 and F2. A width of the upper horizontal portion may be changed depending on a misalignment distance between the first mask BM and the fin regions F1 and F2. For the sake of brevity, such structural variations caused by the misalignment will not be described in much further detail. However, based on the description given herein, such structural variations may be easily achieved, and thus, such structural variations caused by the misalignment are incorporated as substituent embodiments.

Furthermore, the etch barrier pattern 50 may further include a lower horizontal portion (for example, the first portion 50a of FIG. 2A) covering the top surface of the first field insulating layer 30 and an extended portion (for example, the second portion 50b of FIG. 2A) extending upward from the lower horizontal portion to be connected to the upper horizontal portion, in addition to the upper horizontal portion. The extended portion of the etch barrier pattern 50 may be adjacent to the short sides of the fin regions F1 and F2. For example, the extended portion of the etch barrier pattern 50 may be formed to cover directly the short sides of the fin regions F1 and F2.

As described above, in the case where the etch barrier layer 48 includes the first insulating layer 51, the second insulating layer 52, and the buffer layer 53, the etch barrier pattern 50 may include the first insulating pattern 51a, the second insulating pattern 52a, and a buffer pattern 53a that are sequentially stacked. For example, the formation of the etch barrier pattern 50 may include etching the buffer layer 53 using the first mask BM as an etch mask to form the buffer pattern 53a, and then, removing the first mask BM. In example embodiments, the removal of the first mask BM may be performed using an ashing process. Thereafter, the second insulating layer 52 may be etched using the buffer pattern 53a as an etch mask to form the second insulating pattern 52a. In the case where the second insulating layer 52 is a silicon nitride layer, the second insulating pattern 52a may be formed by a wet etching process using, for example, a phosphoric acid solution. The first insulating layer 51 may be wet or dry etched using the buffer pattern 53a and the second insulating pattern 52a as an etch mask to form the first insulating pattern 51a.

In other example embodiments, the formation of the etch barrier pattern 50 may include removing the buffer pattern 53a from the top surface of the first field insulating layer 30. In this case, the etch barrier pattern 50 may include the first and second insulating patterns 51a and 52a, as described with reference to FIGS. 2A and 2B.

Next, the first field insulating layer 30 may be etched using the etch barrier pattern 50 as an etch mask to form the second field insulating layer 32. As a result, the first field insulating layer 30 may be formed between the fin regions F1 and F2 to be adjacent to the side surfaces of the short sides S of the fin regions F1 and F2, and the second field insulating layer 32 may be formed to be adjacent to the side surfaces of the long sides L of the fin regions F1 and F2. The first field insulating layer 30 may be in partial contact with the side surfaces of the short sides S of the fin regions F1 and F2, and the second field insulating layer 32 may be in partial contact with the side surfaces of the long sides L of the fin regions F1 and F2 and have a top surface lower than that of the first field insulating layer 30. For example, the second distance h2, which is a height difference between the top surfaces of the fin regions F1 and F2 and the top surface of the second field insulating layer 32, may be greater than the first distance h1, which is a height difference between the top surfaces of the fin regions F1 and F2 and the top surface of the first field insulating layer 30. Each of the first regions 20 of the fin regions F1 and F2 may protrude from the top surface of the second field insulating layer 32 by the second distance h2 and thereby may serve as a channel region of a multi-gate transistor or a FinFET. The side surface of each of the fin regions F1 and F2 may be partially enclosed by the first and second field insulating layers 30 and 32.

A silicon oxide layer 56 may be formed on exposed surfaces of the fin regions F1 and F2. In example embodiments, the silicon oxide layer 56 may be formed by a thermal oxidation process. In the case where the buffer pattern 53a is a polysilicon or amorphous silicon layer, the buffer pattern 53a may be also oxidized to form a silicon oxide layer.

Figure 7:
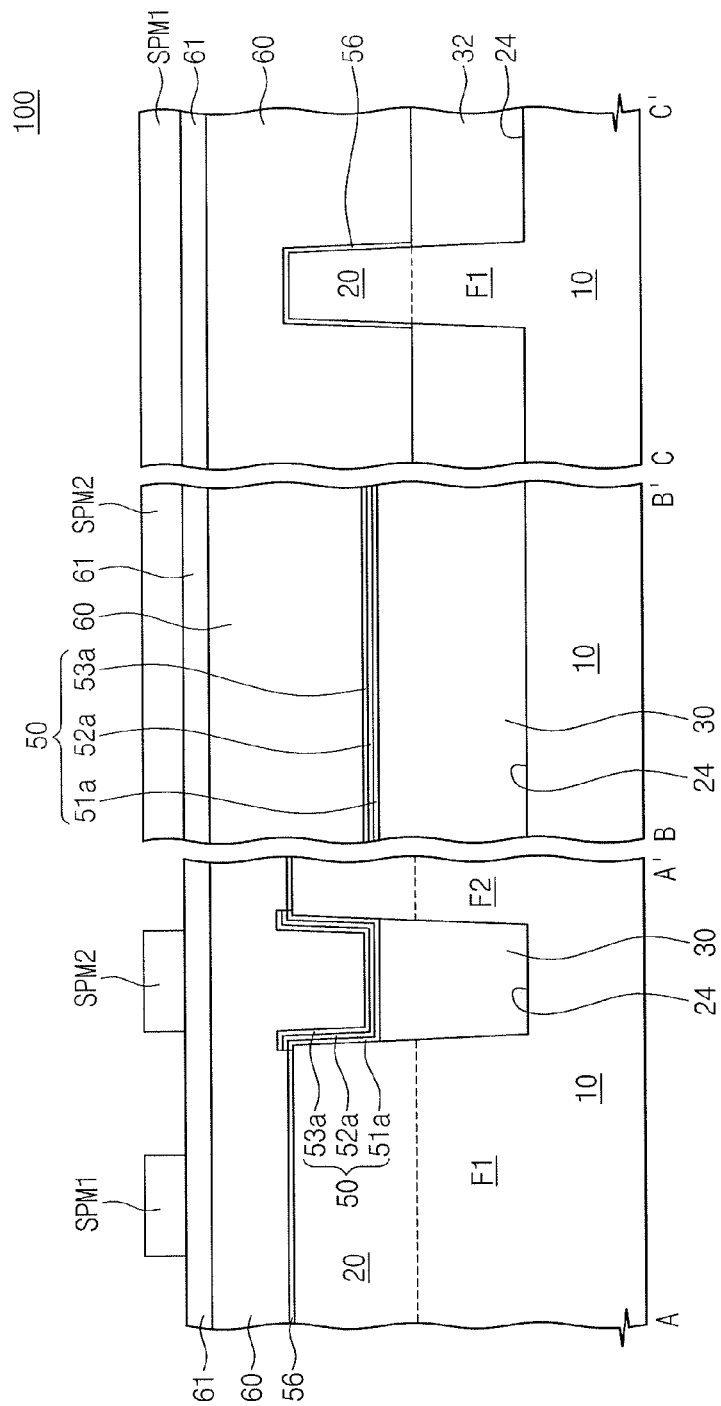

Referring to FIGS. 1 and 7, a sacrificial polysilicon layer 60 and a gate mask layer 61 may be sequentially formed on the resulting structure with the silicon oxide layer 56, and then, second masks SPM1 and SPM2 may be formed on the gate mask layer 61. In example embodiments, the sacrificial polysilicon layer 60 may be formed to cover the silicon oxide layer 56 and the buffer pattern 53a. In other embodiments, the buffer pattern 53a may be wholly removed as described above, and in this case, the sacrificial polysilicon layer 60 may be formed to cover the silicon oxide layer 56 and the second insulating pattern 52a. The gate mask layer 61 may include a silicon nitride layer or a silicon oxynitride layer.

The second masks SPM1 and SPM2 may extend along the second direction Y and be in an overlapping relationship with the first field insulating layer 30 and a portion of the fin regions F1 and F2. The second mask SPM1 may cross the second field insulation layer 32. In example embodiments, the second masks SPM1 and SPM2 may be narrower than the top surface of the first field insulating layer 30. For example, the second masks SPM1 and SPM2 may be formed to have a width that is smaller than that of the buffer pattern 53a of the etch barrier pattern 50. The second masks SPM1 and SPM2 may include a hard mask layer or a photoresist layer. The hard mask layer may be formed of, for example, a spin-on-hardmask (SOH) layer.

Figure 8:
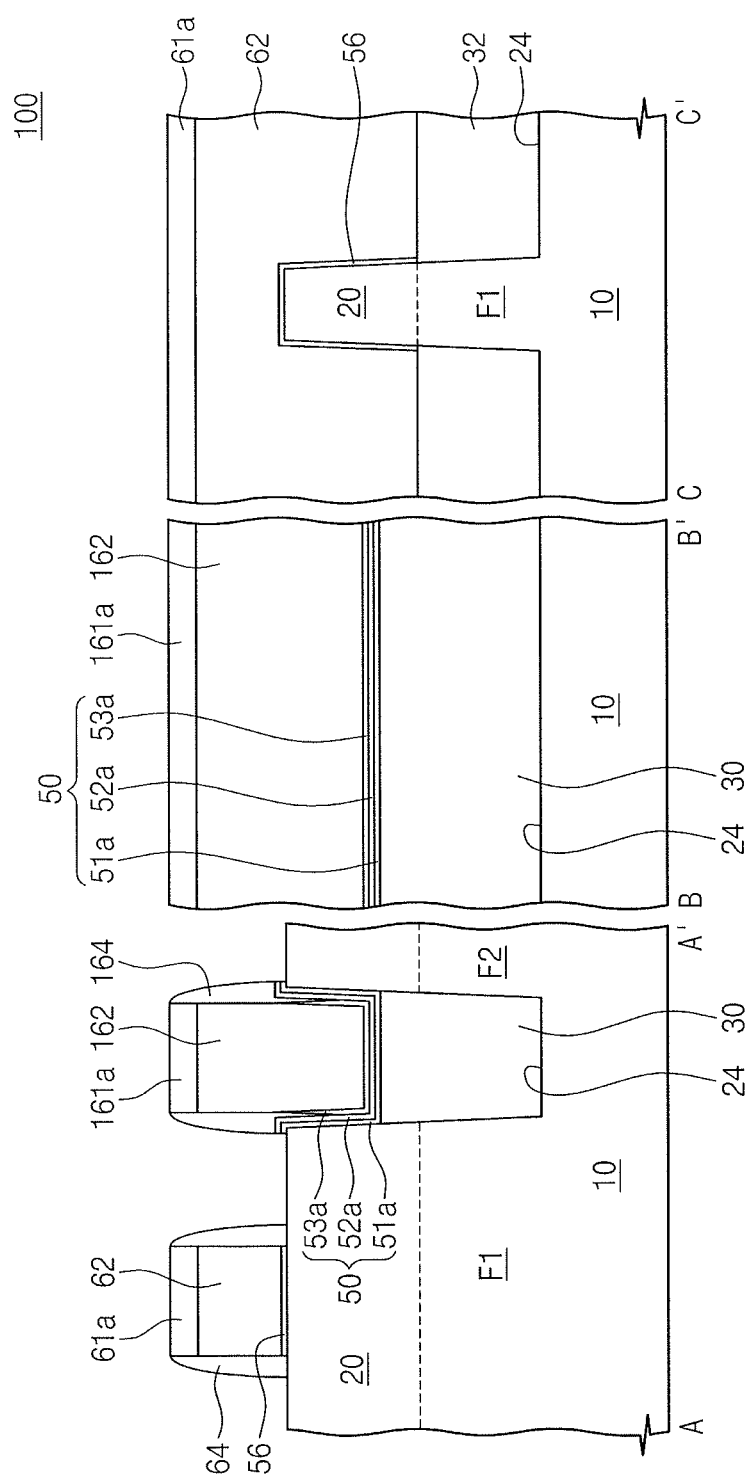

Referring to FIGS. 1 and 8, the gate mask layer 61 and the sacrificial polysilicon layer 60 may be etched using the second masks SPM1 and SPM2 as an etch mask to form gate mask patterns 61a and 161a and sacrificial gates 62 and 162. The sacrificial gates 62 and 162 and the gate mask patterns 61a and 161a may be narrower than the top surface of the first field insulating layer 30. Thereafter, a portion of the silicon oxide layer 56, which is provided on the fin regions F1 and F2 and is not covered with the sacrificial gates 62 and 162, and a portion of the buffer pattern 53a on the first field insulating layer 30 may be removed using the gate mask patterns 61a and 161a as an etch mask. As the result of the removal process, the silicon oxide layer 56 and the buffer pattern 53a may remain under the sacrificial gates 62 and 162. For example, the silicon oxide layer 56 may be disposed between the first sacrificial gates 62 and the fin regions F1 and F2, and the buffer pattern 53a, the first insulating pattern 51a, and the second insulating pattern 52a may be disposed between the first field insulating layer 30 and the second sacrificial gate 162.

After the second masks SPM1 and SPM2 are removed, the first gate spacer 64 and the second gate spacer 164 may be formed on sidewalls of the sacrificial gates 62 and 162, respectively. For example, the formation of the gate spacers 64 and 164 may include forming at least one of a silicon nitride layer or a silicon oxynitride layer on the resulting structure with the sacrificial gates 62 and 162 and then performing a dry etching process. In example embodiments, the gate spacers 64 and 164 may be formed to cover sidewalls of the sacrificial gates 62 and 162 and the gate mask patterns 61a and 161a. A bottom surface of the second gate spacer 164 may be in contact with the etch barrier pattern 50. For example, the second insulating pattern 52a of the etch barrier pattern 50 may be in contact with the second gate spacer 164.

Figure 9:
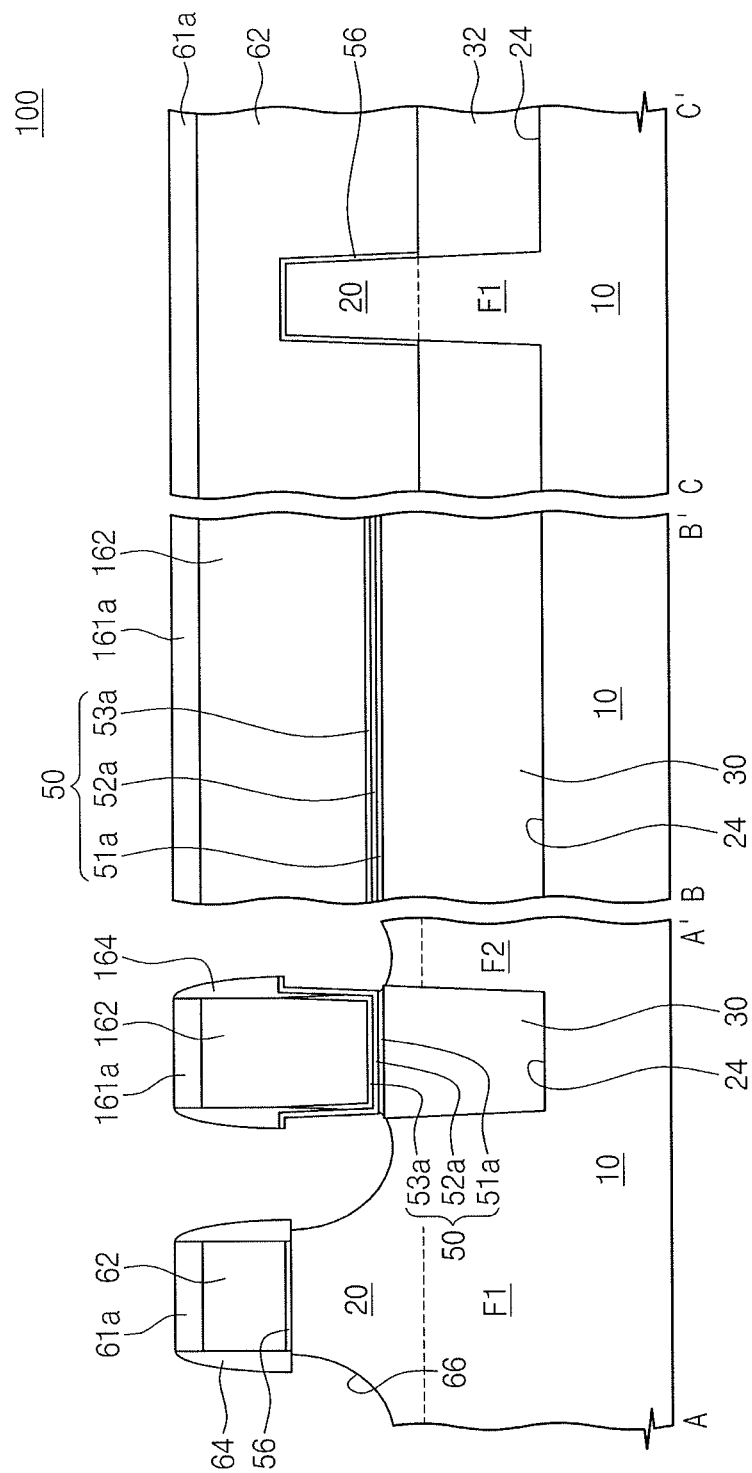

Referring to FIGS. 1 and 9, the substrate of the fin regions F1 and F2 adjacent to the gate spacers 64 and 164 may be etched using the gate mask patterns 61a and 161a and the gate spacers 64 and 164 as an etch mask to form the recess regions 66. For example, the recess regions 66 may be formed to have a bottom surface that may be lower than the top surface of the first field insulating layer 30 and may be higher than the top surface of the second field insulating layer 32. A portion of the etch barrier pattern 50 may be exposed by the recess regions 66. However, the second sacrificial gate 162 on the first field insulating layer 30 may not be exposed by the formation of the recess region 66. For example, the first insulating pattern 51a includes an oxide. Accordingly, the first insulating pattern 51a exposed by the recess regions 66 may be at least partially removed when a cleaning step is performed to the recess regions 66, and thus, the second insulating pattern 52a may be exposed. However, the second insulating pattern 52a includes a material (for example, a nitride) having an etch-resistant property. Accordingly, the second insulating pattern 52a is not etched by the cleaning step, and thus, the second sacrificial gate 162 is not exposed. As a result, as exemplarily shown in FIG. 10, it may be possible to prevent epitaxial layers 68, which will be formed in the recess regions 66, from being unintentionally connected to the second sacrificial gate 162. In other implementations, the etch barrier pattern 50 may not be exposed during the formation of the recess regions 66. For example, the fin regions F1 and F2 may be partially interposed between the recess regions 66 and the etch barrier pattern 50 to separate the recess regions 66 spatially from the etch barrier pattern 50.

Figure 10:
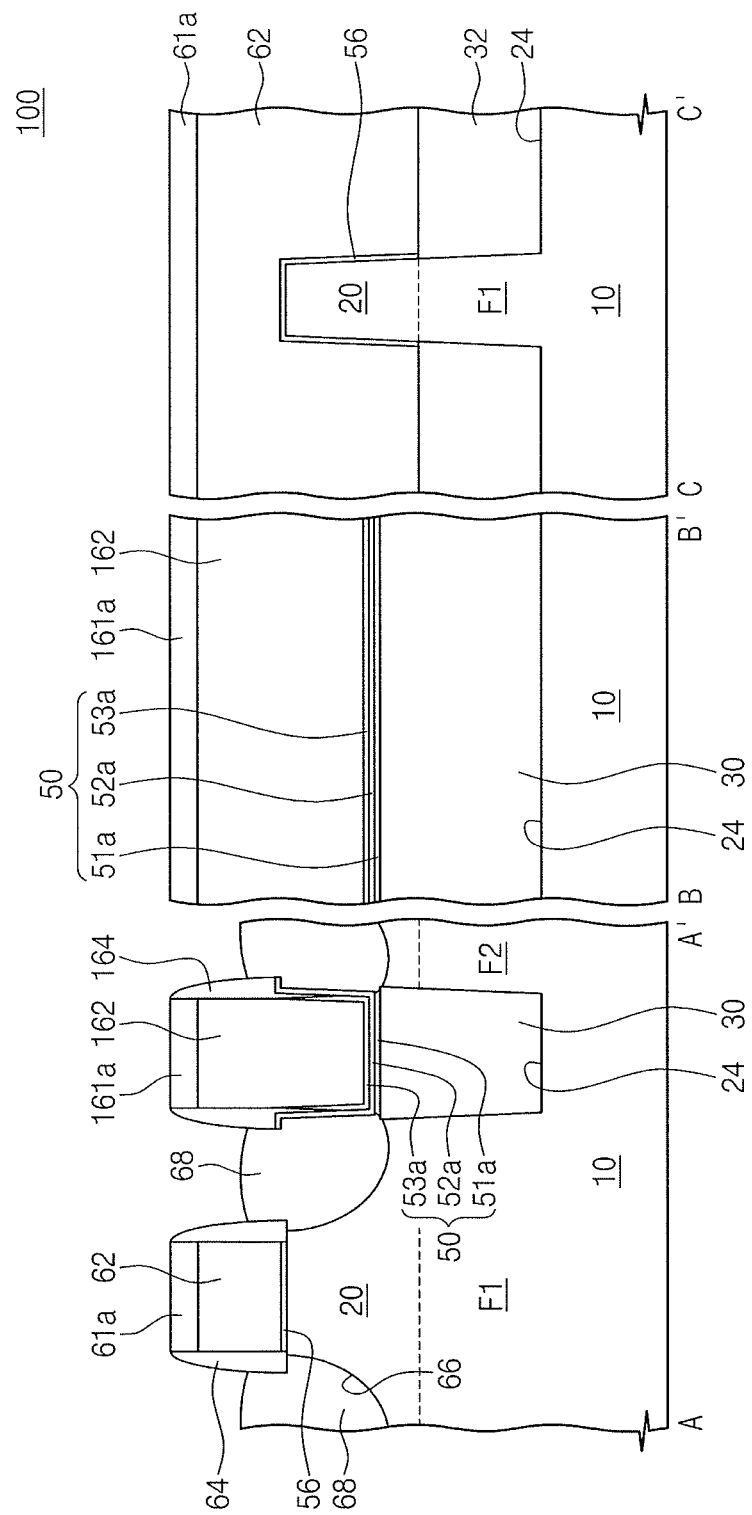

Referring to FIGS. 1 and 10, the epitaxial layer 68 may be formed in each of the recess regions 66. The epitaxial layer 68 may be a semiconductor material formed by a selective epitaxial growth technique. In the case where the semiconductor device 100 is a PMOS transistor, the epitaxial layer 68 may be formed of an epitaxially-grown compressive stress material. The compressive stress material may have a lattice constant greater than that of silicon (Si). For example, the epitaxial layer 68 may be formed as a silicon germanium (SiGe) epitaxial layer. In the case where the semiconductor device 100 is an NMOS transistor, the epitaxial layer 68 may be formed of the same material as the substrate 10 or may be formed of an epitaxially-grown tensile stress material. For example, if the substrate 10 is formed of silicon (Si), the epitaxial layer 68 may be formed as an epitaxial layer of silicon (Si) or silicon carbide (SiC) that is epitaxially grown. A lattice constant of the silicon carbide (SiC) epitaxial layer may be smaller than that of the silicon (Si) epitaxial layer. The epitaxial layer 68 may be formed to have a top surface that is higher than the top surfaces of the fin regions F1 and F2. The epitaxial layers 68 adjacent to the second sacrificial gate 162 may be in contact with a portion of the etch barrier pattern 50. For example, the epitaxial layers 68 adjacent to the second sacrificial gate 162 may be in contact with the extended portion of the etch barrier pattern 50. For example, the epitaxial layers 68 may be in contact with a portion of the second insulating pattern 52a. Due to the presence of the etch barrier pattern 50, it may be possible to prevent the epitaxial layers 68 from being connected to the second sacrificial gate 162.

Figure 11:
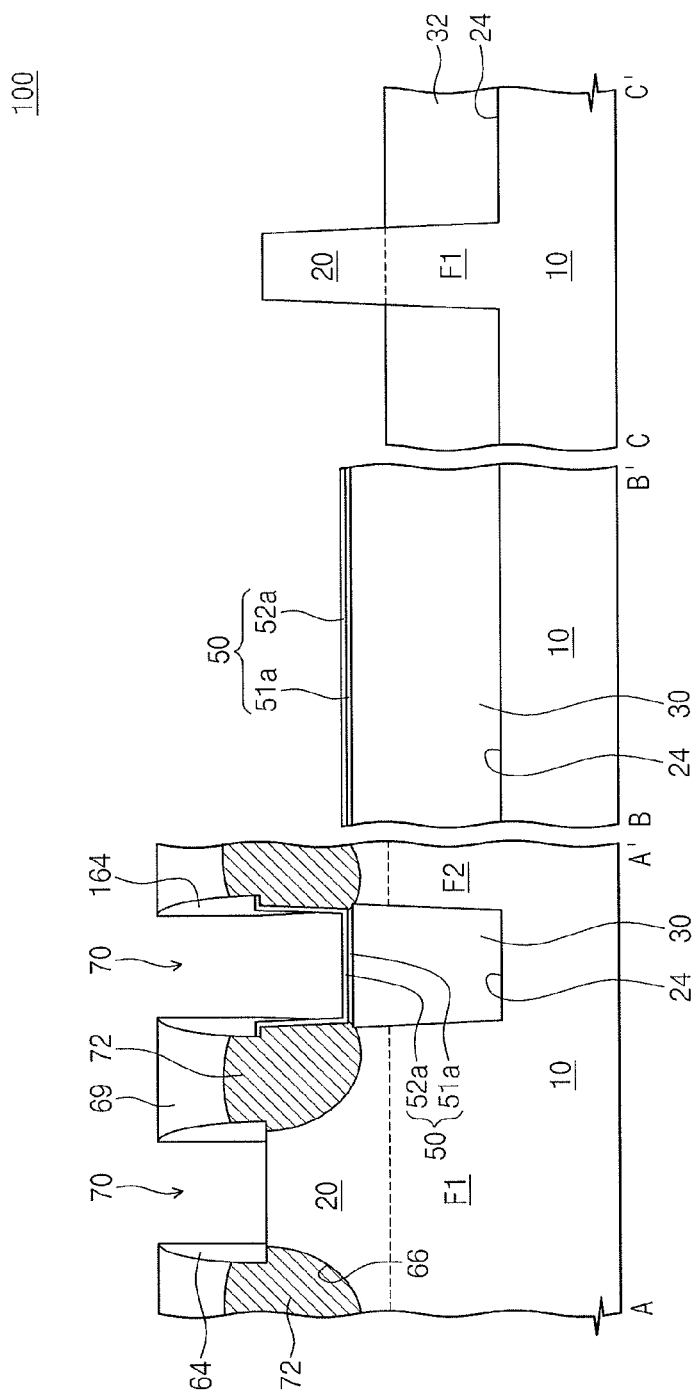

Referring to FIGS. 1 and 11, the epitaxial layers 68 may be doped with impurities to form the source/drain regions 72. For example, during the formation of the epitaxial layers 68 described with reference to FIG. 10, p-type or n-type impurities may be doped in an in-situ manner, thereby forming the source/drain regions 72. In other implementations, the source/drain regions 72 may be formed by performing an ion implantation process, in which p-type or n-type impurities are injected into the epitaxial layers 68, or by diffusing a solid source material into the epitaxial layers 68. A silicide layer may be additionally formed on each of the source/drain regions 72. The silicide layer may include a metallic element, such as nickel (Ni), cobalt (Co), platinum (Pt), or titanium (Ti).

Next, the gate mask patterns 61a and 161a, the sacrificial gates 62 and 162, the silicon oxide layer 56, and the buffer pattern 53a may be removed to form grooves 70. For example, the formation of the grooves 70 may include forming a molding layer 69 on the source/drain regions 72, removing the gate mask patterns 61a and 161a to expose the sacrificial gates 62 and 162, and then, etching the sacrificial gates 62 and 162, the silicon oxide layer 56, and the buffer pattern 53a. In the case where the buffer pattern 53a is an oxide layer, the buffer pattern 53a may also be removed when the silicon oxide layer 56 is removed. During the removal of the buffer pattern 53a, the source/drain regions 72 are not exposed due to the presence of the molding layer 69 and the first and second insulating patterns 51a and 52a of the etch barrier pattern 50. Thus, it may be possible to prevent the source/drain regions 72 from being unintentionally etched.

Figure 12:
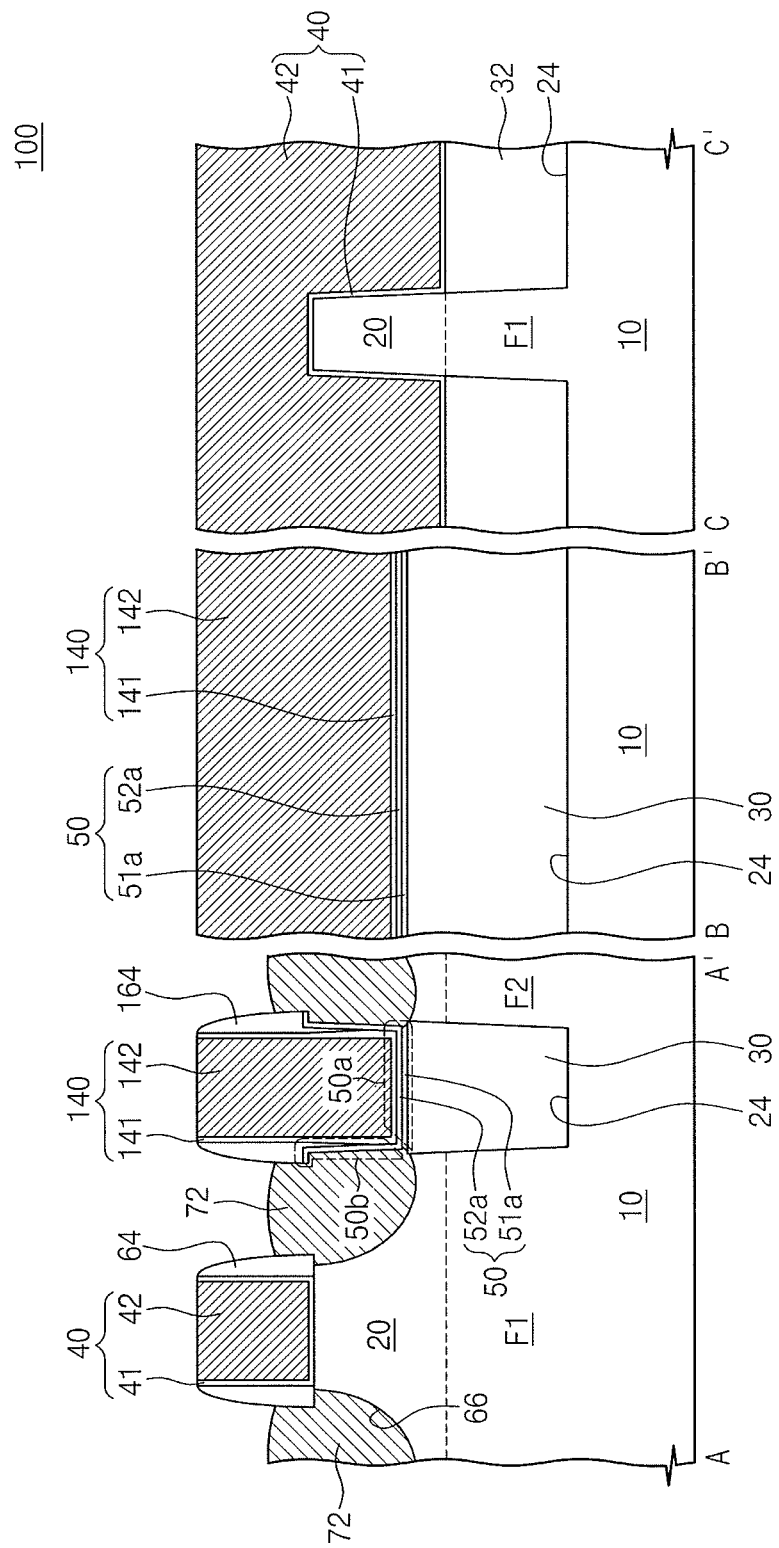

Referring to FIGS. 1 and 12, the gates 40 and 140 may be formed in the grooves 70. The formation of the gates 40 and 140 may include sequentially forming the gate insulating layers 41 and 141 and the gate electrodes 42 and 142 on the resulting structure with the grooves 70, and then, planarizing the resulting structure. The first gate 40 may include the gate insulating layer 41 and the first gate electrode 42, and the second gate 140 may include the second gate insulating layer 141 and the second gate electrode 142.

The gate insulating layers 41 and 141 may include a high-k dielectric material, having a dielectric constant is higher than that of the silicon oxide layer. For example, the gate insulating layers 41 and 141 may include $HfO_2$, $ZrO_2$ or $Ta_2O_5$.

The first gate insulating layer 41 may be formed to cover top and side surfaces of the first region 20 in each of the fin regions F1 and F2. Further, the first gate insulating layer 41 may be formed on the second field insulating layer 32. The second gate insulating layer 141 may be formed on the etch barrier pattern 50.

The gate electrodes 42 and 142 may be formed to fill the remaining spaces of the grooves 70, in which the gate insulating layer 41 and 141 are formed. For example, the first gate electrode 42 formed on the first gate insulating layer 41 may cover the top and side surfaces of the first region 20 and may include a portion provided on the second field insulating layer 32. The second gate electrode 142 formed on the second gate insulating layer 141 may be disposed on the first field insulating layer 30. Each of the gate electrodes 42 and 142 may include at least one metal layer. Each of the gate electrodes 42 and 142 may include at least two metal layers that are sequentially stacked. For example, each of the gate electrodes 42 and 142 may include a first metal layer for controlling a work-function thereof and a second metal layer filling a remaining space of the groove 70 provided with the first metal layer. The first metal layer may include at least one of, for example, TiN, TaN, TiC, or TaC. The second metal layer may include W or Al.

As a result, the etch barrier pattern 50 may be disposed on the first field insulating layer 30 between the fin regions F1 and F2 to extend along the second direction Y. The etch barrier pattern 50 may include the first portion 50a covering the first field insulating layer 30 and the second portion 50b interposed between the source/drain regions 72 and the second gate 140 to extend upward from the first portion 50a. The second portion 50b may be formed between the second gate 140 and the source/drain regions 72 adjacent thereto or between the source/drain regions 72, which are positioned between the first and second gates 40 and 140, and the second gate 140. The first portion 50a may be a horizontal portion that is interposed between the second gate 140 and the first field insulating layer 30. The second portion 50b may be an extended portion extending upward from the first portion 50a. The second portion 50b may include a portion that is disposed below the second gate spacer 164 and that extends along the horizontal direction.

In example embodiments, the first portion 50a of the etch barrier pattern 50 may include the second insulating pattern 52a and the first insulating pattern 51a, and the second portion 50b of the etch barrier pattern 50 may include the second insulating pattern 52a.

The etch barrier pattern 50 may be in contact with the source/drain regions 72 disposed between the first and second gates 40 and 140. For example, the second portion 50b may be in contact with the source/drain regions 72 disposed between the first and second gates 40 and 140. For example, the second portion 50b may cover the side surfaces of the source/drain regions 72 disposed between the first and second gates 40 and 140. The etch barrier pattern 50 may prevent the source/drain regions 72 from being connected to the second gate electrode 142, thereby allowing the semiconductor device 100 to have high reliability. In example embodiments, each of the source/drain regions 72 may include the epitaxial layer, and the second portion 50b of the etch barrier pattern 50 may be in contact with the epitaxial layer of the source/drain regions 72 adjacent to the second gate 140. For example, the second insulating pattern 52a of the second portion 50b may be in contact with the epitaxial layer.

The second portion 50b may be in contact with the second gate spacer 164 and the second gate insulating layer 141. The first portion 50a may be in contact with the first field insulating layer 30 and the second gate insulating layer 141. In other implementations, the first portion 50a may include only the second insulating pattern 52a, without the first insulating pattern 51a. In this case, the second insulating pattern 52a may be in contact with the first field insulating layer 30.

In example embodiments, the second insulating pattern 52a of the etch barrier pattern 50 may be formed to surround bottom and lower side surfaces of the second gate 140, thereby having a 'U'-shaped section. Further, the second insulating pattern 52a may directly cover the sidewalls of the source/drain regions 72 adjacent to the second gate 140.

In example embodiments, the second insulating pattern 52a of the second portion 50b may be in direct contact with the second gate insulating layer 141 and the source/drain regions 72 adjacent to the second gate 140. The second insulating pattern 52a may also be in direct contact with the second gate spacer 164. The second insulating pattern 52a of the first portion 50a may be in direct contact with the second gate insulating layer 141 thereon and the first insulating pattern 51a thereunder.

In other implementations, the first insulating pattern 51a of the first portion 50a may be in direct contact with the first field insulating layer 30 and be an isolated pattern locally provided on the first field insulating layer 30. The first insulating pattern 51a of the first portion 50a may be in contact with the source/drain regions 72 adjacent to the second gate 140. In other implementations, the first insulating pattern 51a of the first portion 50a may be in contact with the first field insulating layer 30 and may include a vertically-extended portion that is in contact with the side surfaces of the short sides S of the fin regions F1 and F2 on the first field insulating layer 30.

Figure 13:
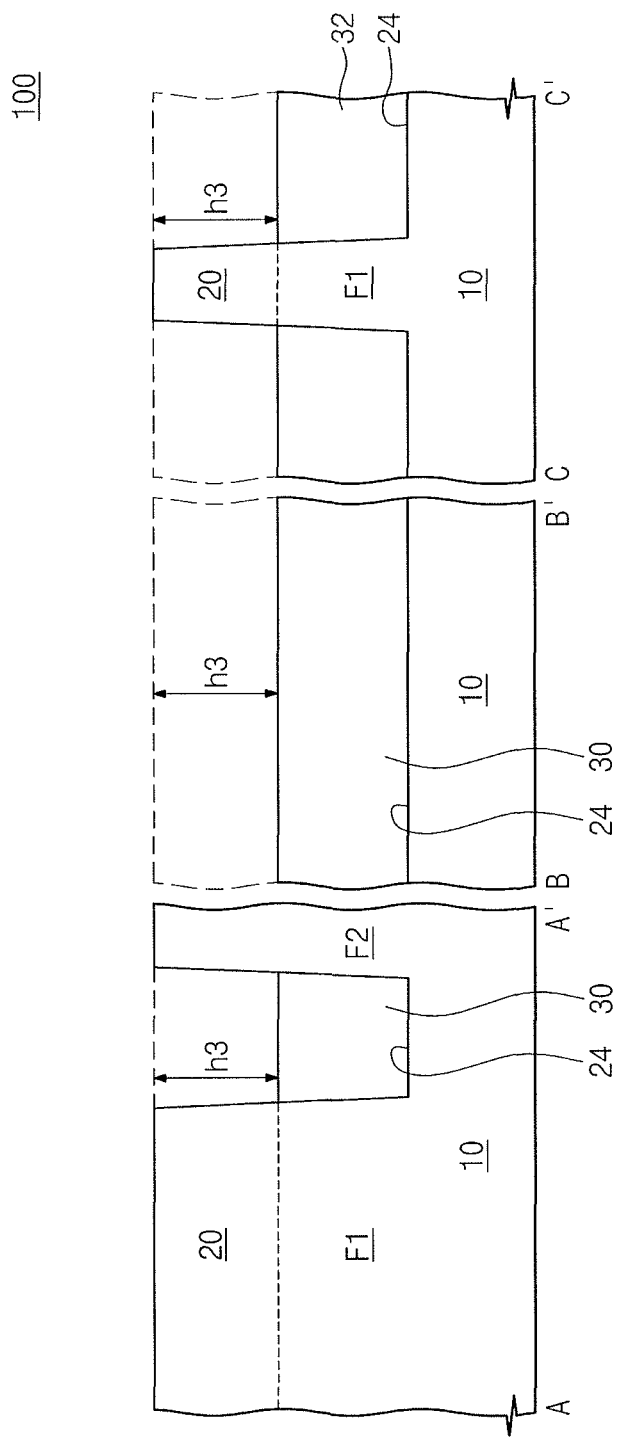
FIGS. 13 through 15 are schematic sectional views illustrating stages of a process of fabricating a semiconductor device, according to other example embodiments.
Figure 14:
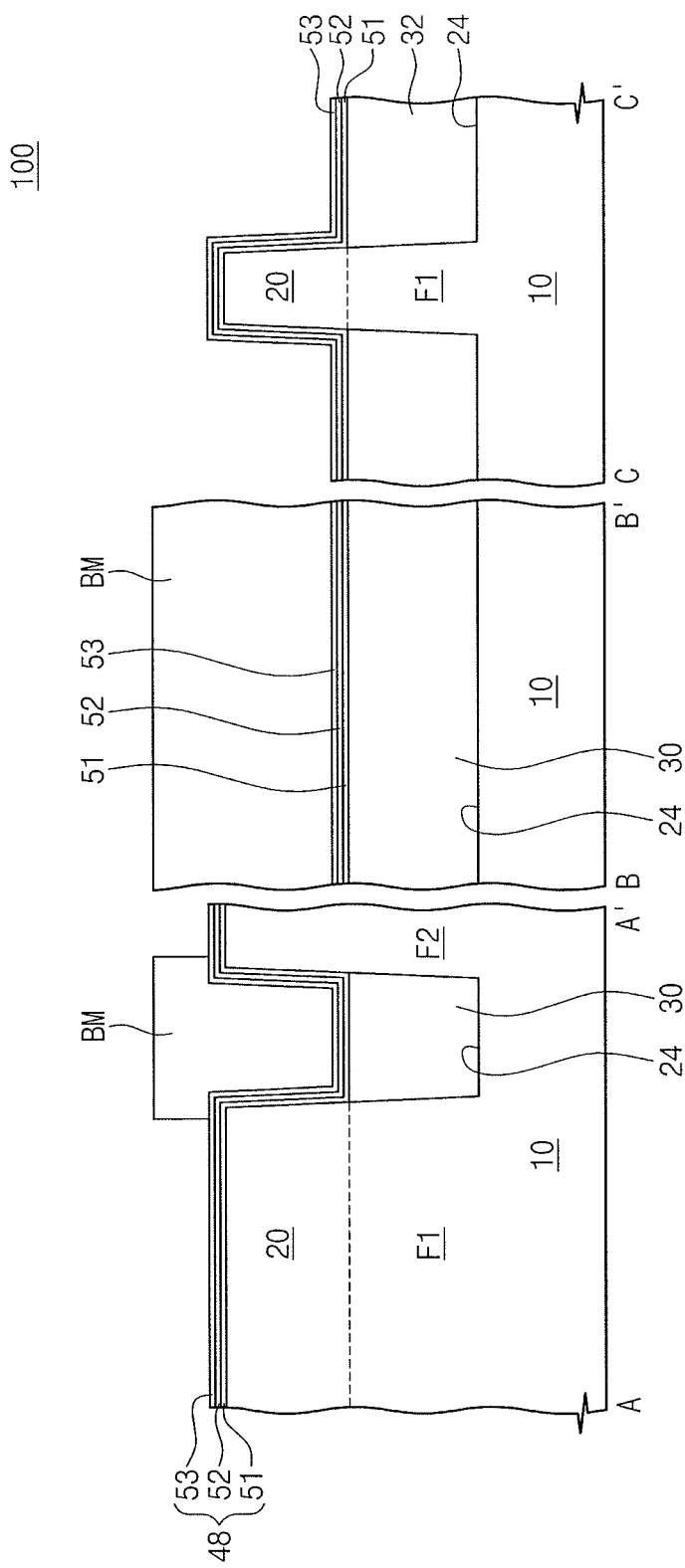
Figure 15:
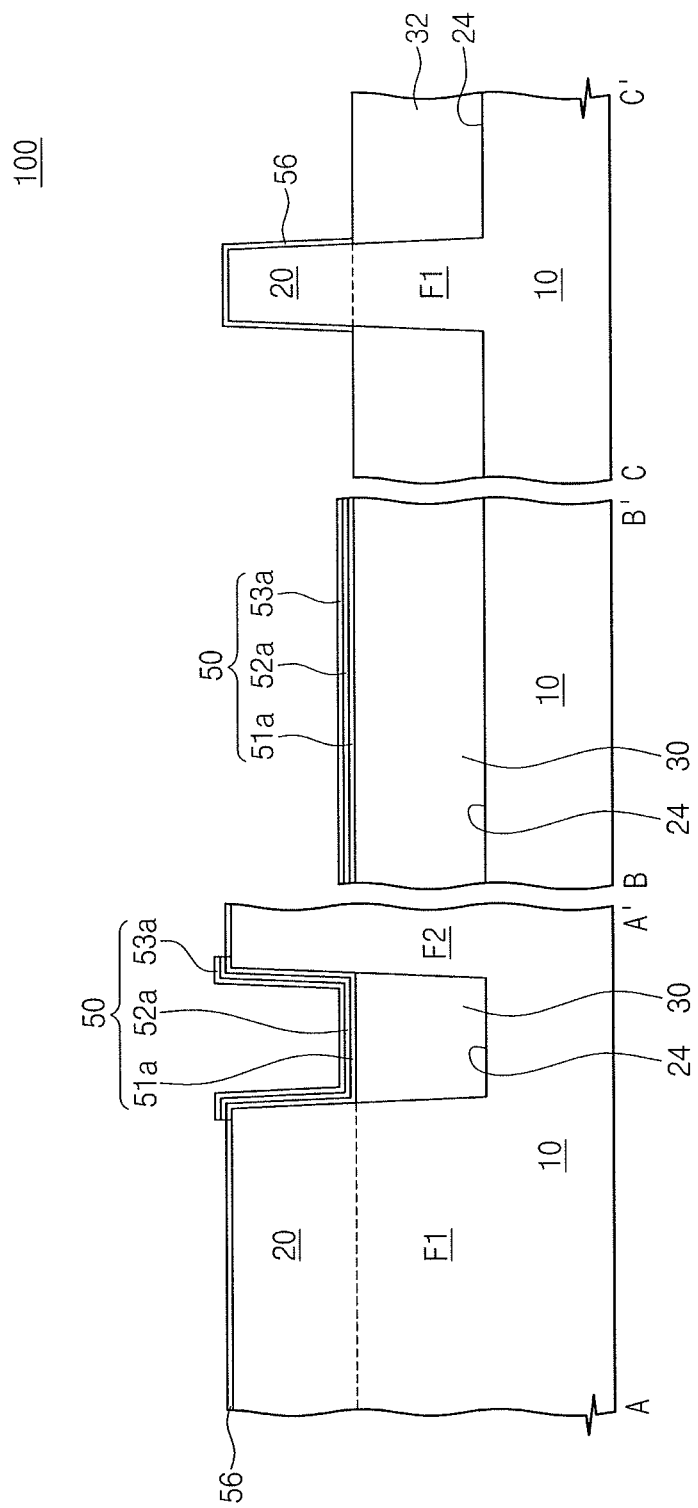

FIGS. 13 through 15 are schematic sectional views illustrating stages of a process of fabricating a semiconductor device, according to other example embodiments. In detail, each of FIGS. 13 through 15 are sectional views taken along lines A-A', B-B', and C-C' of FIG. 1 to illustrate schematically intermediate stages of the process.

Referring to FIGS. 3 and 13, the field insulating layer 28 may be recessed to form the first and second field insulating layers 30 and 32. The first field insulating layer 30 may be formed adjacent to the side surface of the short side S of each of the fin regions F1 and F2 between the fin regions F1 and F2, and the second field insulating layer 32 may be formed adjacent to the side surface of the long side L of each of the fin regions F1 and F2. The first and second field insulating layers 30 and 32 may be formed to have top surfaces that are substantially coplanar with each other. For example, a distance h3 between the top surfaces of the fin regions F1 and F2 and the top surface of the first field insulating layer 30 may be substantially equal to a distance h3 between the top surfaces of the fin regions F1 and F2 and the top surface of the second field insulating layer 32. The first and second field insulating layers 30 and 32 may be connected to each other. Portions of the first regions 20 of the fin regions F1 and F2 that protrude by the distance h3 from the top surface of the second field insulating layer 32 may be used as a channel region of a multi-gate transistor or a Fin-FET.

Referring to FIG. 14, the etch barrier layer 48 may be formed on the first field insulating layer 30 using, for example, the method described with reference to FIG. 5, and then, the first mask BM may be formed thereon.

Referring to FIG. 15, the etch barrier layer 48 may be patterned to form the etch barrier pattern 50. According to the present embodiment, the additionally etching of the first field insulating layer 30 for forming the second field insulating layer 32 may be omitted. Except for this difference, the etch barrier pattern 50 may be formed using substantially the same method as that previously described with reference to FIG. 6.

Thereafter, subsequent steps may be performed to the resulting structure with the etch barrier pattern 50 in the same manner as those described with reference to FIGS. 7 through 12. Except for the difference in height between the top surfaces of the fin regions F1 and F2 and the first field insulating layer 30, the semiconductor device 100 may be configured to have substantially the same or similar features as those of the previous embodiments described with reference to FIGS. 7 through 12.

Figure 16:
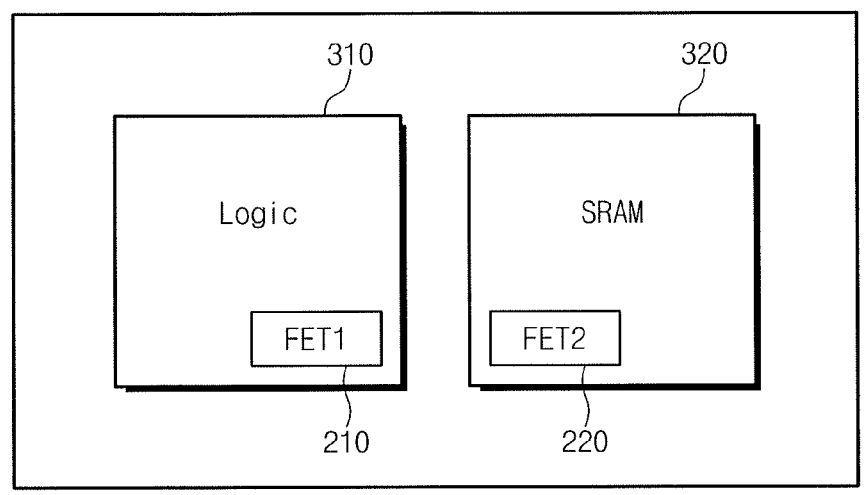
FIG. 16 is a schematic block diagram illustrating a semiconductor product including the semiconductor device according to example embodiments.

FIG. 16 is a schematic block diagram illustrating a semiconductor product 200 including the semiconductor device 100 according to example embodiments Referring to FIG. 16, the semiconductor product 200 may include a logic region 310 provided with a multi-gate transistor 210 and a SRAM region 320 provided with a multi-gate transistor 220. At least one of the multi-gate transistors 210 and 220 may be formed to have substantially the same features as the semiconductor device 100 previously described with reference to FIGS. 1 through 15. In example embodiments, the semiconductor product 200 may further include at least one other memory region, which may be configured to have, for example, DRAM, MRAM, RRAM, or PRAM devices, in addition to the SRAM region 320. The memory device to be formed on the other memory region may be configured to have substantially the same features as those of the semiconductor device 100 according to example embodiments.

Figure 17:
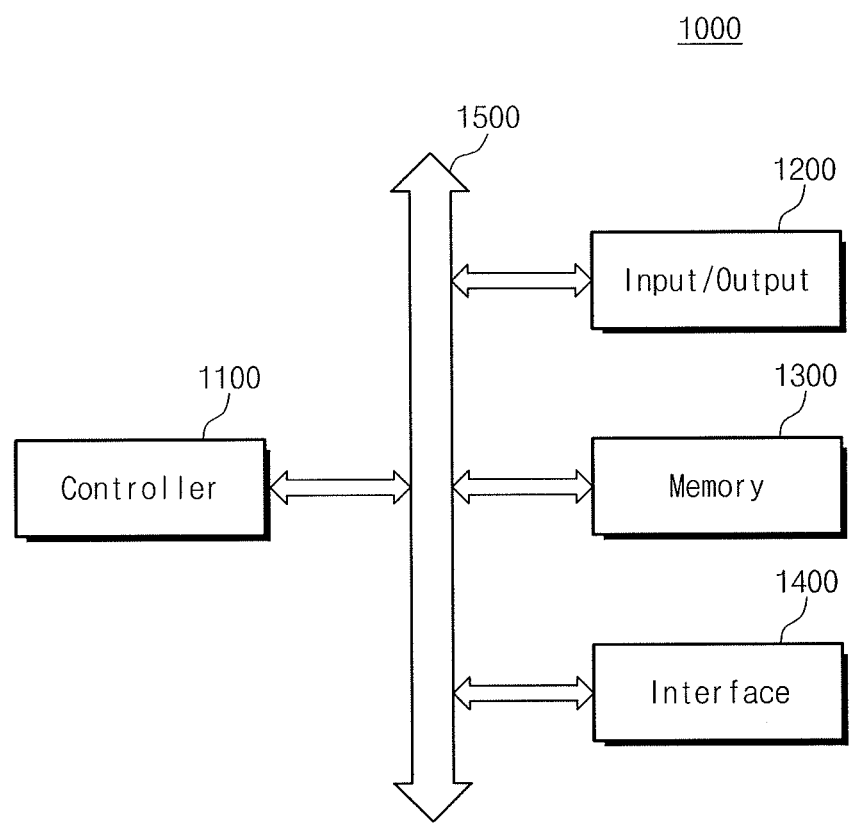
FIG. 17 is a schematic block diagram illustrating an electronic system including the semiconductor device according to example embodiments.

FIG. 17 is a schematic block diagram illustrating an electronic system including the semiconductor device according to example embodiments. The electronic system of FIG. 17 may be an electronic system including at least one of the semiconductor devices described with reference to FIGS. 1 through 16.

Referring to FIG. 17, an electronic system 1000 according to example embodiments may include a controller 1100, an input/output (I/O) unit 1200, a memory device 1300, an interface unit 1400, and a data bus 1500. At least two of the controller 1100, the I/O unit 1200, the memory device 1300, and the interface unit 1400 may communicate with each other through the data bus 1500. The data bus 1500 may correspond to a path through which electrical signals are transmitted.

The controller 1100 may include at least one of a microprocessor, a digital signal processor, a microcontroller, or another logic device. The other logic device may have a similar function to any one of the microprocessor, the digital signal processor, and the microcontroller. The I/O unit 1200 may include a keypad, a keyboard, or a display unit. The memory device 1300 may store data and/or commands. The memory device 1300 may further include another type of data storing device that are different from the data storing devices described above. The interface unit 1400 may transmit electrical data to a communication network or may receive electrical data from a communication network. The interface unit 1400 may operate by wireless or cable. For example, the interface unit 1400 may include an antenna for wireless communication or a transceiver for cable communication. Although not shown in the drawings, the electronic system 1000 may further include a fast DRAM device and/or a fast SRAM device that acts as a cache memory for improving an operation of the controller 1100. The semiconductor device 100 according to example embodiments may be provided in the memory device 1300 or serve as components of the controller 1100 and/or the I/O unit 1200.

The electronic system 1000 may be applied to a personal digital assistant (PDA), a portable computer, a web tablet, a wireless phone, a mobile phone, a digital music player, a memory card, or other type of electronic product. The electronic product may receive or transmit information data by wireless.

By way of summation and review, a multi-gate transistor has been proposed as one of scaling technologies for high density semiconductor devices. The multi-gate transistor is configured to have a fin-shaped silicon body on a substrate and a gate electrode on the silicon body.

Since the multi-gate transistor has a three-dimensional channel, it can be easily scaled down. Further, it is possible to improve an ability of the multi-gate transistor to control an electric current without increasing a gate length. A multi gate transistor or FIN-FET including a gate electrode formed on a fin region may be used for scaling a semiconductor device. In a structure having a plurality of fin regions, a dummy gate may be disposed on a field insulating layer between the fin regions, and a normal gate may be disposed to cross the fin region. In the case where a height of the dummy gate is smaller than that of the normal gate, the dummy gate may have increased resistance, which may lead to a signal transmission delay. To increase a height of the dummy gate, the field insulating layer may be formed to have a lowered top surface. However, in this case, a lower portion of the dummy gate may be located below the top surface of the fin region, thereby being adjacent to a side surface of the fin region.

The dummy gate may be formed by a gate last process. The gate last process may include, for example, forming a sacrificial gate, forming a source/drain epitaxial layer in the fin region, removing the sacrificial gate, and forming a dummy gate in a space formed by the removal of the sacrificial gate. However, during the removal of the sacrificial gate, there is a risk that a portion of the epitaxial layer adjacent to the sacrificial gate could be roughly etched. Accordingly, it may be difficult to form a gate insulating layer uniformly on the etched region of the epitaxial layer. Thus, the gate electrode to be formed on the gate insulating layer may be unintentionally connected to the epitaxial layer.

According to example embodiments, an etch barrier pattern may be formed on the field insulating layer to prevent the epitaxial layer from being connected to the dummy gate. A semiconductor device may be configured to prevent a dummy gate electrode provided on a field insulating layer from being unintentionally connected to a source/drain region of a fin region. The semiconductor device may have improved reliability.

Example embodiments provide a semiconductor device configured to prevent a dummy gate electrode and a source/drain region from being coupled to each other. Thereby, the semiconductor device may have improved reliability.

Other example embodiments provide a method of fabricating a semiconductor device in which a dummy gate electrode and a source/drain region are prevented from being coupled to each other. The semiconductor device formed thereby may have improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a fin region with a long side and a short side;
a first field insulating layer including a top surface lower than a top surface of the fin region, the first field insulating layer being adjacent to a side surface of the short side of the fin region;
a second field insulating layer including a top surface lower than the top surface of the fin region, the second field insulating layer being adjacent to a side surface of the long side of the fin region;
an etch barrier pattern on the first field insulating layer;
a first gate on the fin region and the second field insulating layer, the first gate facing the top surface of the fin region and a side surface of the long side of the fin region;
a second gate on the etch barrier pattern, the second gate being in an overlapping relationship with the first field insulating layer; and
a source/drain region between the first gate and the second gate, the source/drain region being in contact with the etch barrier pattern.

2. The device as claimed in claim 1, wherein a distance from the top surface of the fin region to the top surface of the first field insulating layer is less than a distance from the top surface of the fin region to the top surface of the second field insulating layer.

3. The device as claimed in claim 1, wherein a thickness of the first gate on the fin region is less than a thickness of the second gate on the etch barrier pattern.

4. The device as claimed in claim 1, wherein the etch barrier pattern includes a first portion covering the first field insulating layer and a second portion between the source/drain region and the second gate, the second portion extending upward from the first portion.

5. The device as claimed in claim 4, further comprising a gate spacer on a sidewall of the second gate, wherein the second portion of the etch barrier pattern is in contact with the gate spacer and the source/drain region.

6. The device as claimed in claim 1, wherein:
the etch barrier pattern includes a first insulating pattern and a second insulating pattern,
the first portion includes the first insulating pattern and the second insulating pattern, and
the second portion includes the second insulating pattern.

7. The device as claimed in claim 6, wherein the first insulating pattern includes a silicon oxide layer, and the second insulating pattern includes a silicon nitride layer or a silicon oxynitride layer.

8. A semiconductor device, comprising:
a pair of fin regions;
at least one first gate crossing each of the pair of fin regions;
a second gate parallel to the first gate and between the pair of fin regions;
a first field insulating layer below the second gate;
a second field insulating layer below the first gate;
source/drain regions between the first and second gates; and
an etch barrier pattern between the first field insulating layer and the second gate, the etch barrier pattern covering sidewalls of the source/drain regions.

9. The device as claimed in claim 8, wherein:
the first field insulating layer has a top surface lower than top surfaces of the fin regions, and
the second field insulating layer has a top surface lower than a top surface of the first field insulating layer,
the first and second field insulating layers extending along different directions from each other.

10. The device as claimed in claim 8, wherein the etch barrier pattern includes:
a horizontal portion between the first field insulating layer and the second gate; and
an extended portion extending upward from the horizontal portion to cover the sidewalls of the source/drain regions.

11. The device as claimed in claim 10, wherein the etch barrier pattern includes an insulating pattern covering bottom and lower side surfaces of the second gate, thereby having a 'U'-shaped section, the insulating pattern directly covering the sidewalls of the source drain regions.

12. The device as claimed in claim 8, wherein the insulating pattern includes a nitride layer.

13. A semiconductor device, comprising:
a pair of fin regions, each of the pair of fin regions being crossed by at least one first gate;
a second gate between the pair of fin regions, the second gate including a second gate electrode parallel to the first gate;
a first field insulating layer below the second gate;
source/drain epitaxial regions in the fin regions between the first and second gates, the source/drain epitaxial regions having sidewalls facing the second gate; and
an etch barrier pattern between the first field insulating layer and the second gate, and between the source/drain epitaxial regions and the second gate.

14. The device as claimed in claim 13, wherein:
the etch barrier pattern includes a first portion between the first field insulating layer and the second gate and a second portion between the source/drain epitaxial regions and the second gate,
the first portion of the etch barrier pattern includes a silicon oxide layer, and
the second portion of the etch barrier pattern includes a silicon nitride layer or a silicon oxynitride layer.

15. The device as claimed in claim 14, further including a gate insulating layer between the second gate electrode and the etch barrier pattern.

16. The device as claimed in claim 15, further including a gate spacer on a side surface of the second gate, the second portion of the etch barrier pattern extending between a lower portion of the gate spacer and the source/drain epitaxial regions.

17. The device as claimed in claim 13, wherein:
the first field insulating layer has a top surface lower than a top surface of the fin regions,
the source/drain epitaxial regions are in recess portions of the fin regions, and
bottom surfaces of the source/drain epitaxial regions are lower than a top surface of the first field insulating region.

* * * * *